US008754595B2

(12) United States Patent
Anderson

(10) Patent No.: US 8,754,595 B2
(45) Date of Patent: Jun. 17, 2014

(54) LIGHT ARRAY MAINTENANCE SYSTEM AND METHOD

(71) Applicant: Deloren E. Anderson, Crosslake, MN (US)

(72) Inventor: Deloren E. Anderson, Crosslake, MN (US)

(*) Notice: Subject to any disclaimer, the term of this patent is extended or adjusted under 35 U.S.C. 154(b) by 0 days.

(21) Appl. No.: 13/892,941

(22) Filed: May 13, 2013

(65) Prior Publication Data

US 2013/0257285 A1 Oct. 3, 2013

Related U.S. Application Data

(63) Continuation of application No. 12/722,453, filed on Mar. 11, 2010, now Pat. No. 8,441,214.

(60) Provisional application No. 61/263,312, filed on Nov. 20, 2009, provisional application No. 61/159,345, filed on Mar. 11, 2009.

(51) Int. Cl.
*H05B 37/00* (2006.01)
(52) U.S. Cl.
USPC ............ 315/318; 315/312; 315/316; 315/119; 362/227; 362/231; 362/236; 362/276; 362/613
(58) Field of Classification Search
CPC ............ H05B 33/0875; H05B 33/0893; H05B 33/0833; H05B 33/0824; H05B 33/0803; H05B 33/0857
USPC ......... 315/312, 316, 318, 360, 362, 119, 129, 315/307; 362/227, 236, 249.02, 294, 543, 362/545, 555, 559, 613, 800, 231, 276
See application file for complete search history.

(56) References Cited

U.S. PATENT DOCUMENTS

| 4,847,531 | A | 7/1989 | Tsuji et al. |
| 5,036,248 | A | 7/1991 | Mcewan et al. |
| 5,688,042 | A | 11/1997 | Madadi et al. |
| 5,726,535 | A | 3/1998 | Yan |
| 5,850,126 | A | 12/1998 | Kanbar |
| 5,924,784 | A | 7/1999 | Chliwnyj et al. |
| 6,285,140 | B1 | 9/2001 | Ruxton |

(Continued)

FOREIGN PATENT DOCUMENTS

| DE | 202008004620 U1 | 6/2008 |
| DE | 202008012317 U1 | 11/2008 |
| WO | WO-0056066 A1 | 9/2000 |
| WO | WO-2009076770 A1 | 6/2009 |

OTHER PUBLICATIONS

"U.S. Appl. No. 12/722,453, Notice of Allowance mailed Aug. 3, 2012", 9 pgs.

(Continued)

*Primary Examiner* — Haiss Philogene
(74) *Attorney, Agent, or Firm* — Schwegman Lundberg & Woessner, P.A.

(57) ABSTRACT

A lighting system includes a plurality of LED lights having at least two different color LED lights. A controller is coupled to the LED lights for independently controlling the intensity of sets of different color LED lights. A program stored on a storage device is operable on the controller to control the intensity of each of the different sets of different color LED lights to produce light representative of color and intensity changes of outdoor daylight conditions.

12 Claims, 16 Drawing Sheets

(56) References Cited

U.S. PATENT DOCUMENTS

| | | | |
|---|---|---|---|
| 6,776,496 B2 | 8/2004 | Cok | |
| 7,014,336 B1 | 3/2006 | Ducharme et al. | |
| 7,520,634 B2 | 4/2009 | Ducharme et al. | |
| 7,572,028 B2 | 8/2009 | Mueller et al. | |
| 7,615,939 B2 * | 11/2009 | Halter | 315/307 |
| 7,762,700 B2 * | 7/2010 | Luo et al. | 362/545 |
| 7,841,740 B2 * | 11/2010 | Zhou et al. | 362/249.02 |
| 7,905,639 B2 * | 3/2011 | Luo et al. | 362/487 |
| 7,972,037 B2 * | 7/2011 | Anderson | 362/294 |
| 8,100,552 B2 | 1/2012 | Spero | |
| 8,188,878 B2 | 5/2012 | Pederson et al. | |
| 8,294,371 B2 * | 10/2012 | Ghanem et al. | 315/119 |
| 8,297,791 B2 * | 10/2012 | Kuang et al. | 362/249.02 |
| 8,441,214 B2 * | 5/2013 | Anderson | 315/318 |
| 8,545,060 B2 * | 10/2013 | Anderson | 362/294 |
| 2006/0176303 A1 | 8/2006 | Fairclough | |
| 2007/0073704 A1 | 3/2007 | Bowden et al. | |
| 2008/0048568 A1 | 2/2008 | Chou et al. | |
| 2009/0080201 A1 | 3/2009 | Wu | |
| 2009/0141474 A1 | 6/2009 | Kolodin | |

OTHER PUBLICATIONS

"U.S. Appl. No. 12/781,447, Notice of Allowance mailed Jan. 18, 2013", 9 pgs.

"International Application Serial No. PCT/US2010/057481, Preliminary Report on Patentability mailed May 31, 2012", 8 pgs.

"International Application Serial No. PCT/US2010/057481, Search Report and Written Opinion mailed Feb. 24, 2011", 15 pgs.

"International Application Serial No. PCT/US2010/057481, Search Report mailed Feb. 24, 2011", 107.

Boyce, Peter, et al., "The Benefits of Daylight through Windows", U.S. Department of Energy, (Sep. 12, 2003), 88 pgs.

* cited by examiner

LIGHT ARRAY MAINTENANCE SYSTEM AND METHOD

RELATED APPLICATIONS

This application is a continuation of U.S. patent application Ser. No. 12/722,453, filed Mar. 11, 2010 and issued on May 14, 2013 as U.S. Pat. No. 8,441,214, which claims priority to U.S. Provisional Application Ser. No. 61/159,345 (entitled LIGHT ARRAY MAINTENANCE SYSTEM AND METHOD, filed Mar. 11, 2009), and claims priority to U.S. Provisional Application Ser. No. 61/263,312 (entitled LIGHT ARRAY MAINTENANCE SYSTEM AND METHOD, filed Nov. 20, 2009) all of which applications are incorporated by reference herein in their entirety.

BACKGROUND

Light emitting diodes have long been used individually or grouped together as background or indicating lights in electronic devices. Because of the efficient light production, durability, long life, and small size light emitting diodes were ideal for electronic applications.

Higher powered light emitting diodes also are used in applications where a stronger emission of light is needed. In some high intensity applications, multiple fixed sets of serially connected light emitting diodes, each set having a common voltage drop are used to obtain desired luminescence. The sets are formed along rails or bars, where an entire rail or bar may be replaced by the manufacturer if any portion of the rail becomes defective. If the manufacturer is located a long distance, or has a backlog of repairs to make, it can take a long time to obtain such a repair. Such applications may be used indoors or outdoors. The light emitting diodes electrically connected operate as a single application, sealed and protected as a single linear group. Replacement of the whole group of fixed light emitting diodes is needed if just one diode fails.

In outdoor settings, an array of light emitting diodes may consist of multiple sets of light emitting diodes. One or more of the diodes may be inoperative, due to either wearing out, defective manufacturing, or vandalism. It may be difficult to detect whether one or more light emitting diodes are inoperative due to their brightness. Further, organizations, such as municipalities may have many such arrays operating over a wide geographic are. While reports from citizens may be collected to help identify light emitting diodes that need replacing, it is difficult to ensure that all inoperative light emitting diodes are replaced. Maintenance thus becomes a difficult proposition.

DETAILED DESCRIPTION

In the following description, reference is made to the accompanying drawings that form a part hereof, and in which is shown by way of illustration specific embodiments which may be practiced. These embodiments are described in sufficient detail to enable those skilled in the art to practice the invention, and it is to be understood that other embodiments may be utilized and that structural, logical and electrical changes may be made without departing from the scope of the present invention. The following description of example embodiments is, therefore, not to be taken in a limited sense, and the scope of the present invention is defined by the appended claims.

The present application describes several embodiments of light fixtures, some of which have arrays of replaceable light emitting diode modules. Maintaining light fixtures includes identifying a high intensity light emitting diode that needs replacing in a light fixture having a high volume light emitting diode lighting array having a plurality of electrical sockets supported by a matrix and forming a matrix of electrical sockets. An ID of the light fixture is provided, and the light fixture transmits the ID and an indication that a light emitting diode needs replacing. The ID uniquely identifies the light fixture and has an associated location of the light fixture.

Further embodiment are described that display light in accordance with a program that may be representative of a pre-recorded outdoor light sequence, such as a day in the sun with clouds drifting past the sun. The result is a simulated day in the sun. The natural variations in color and intensity of the light provided by such a recording or program may provide a relaxing environment. Light can affect the production of melatonin by the pineal gland in humans. Melatonin can be important in regulating circadian rhythms and sleep cycles. Natural sunlight, including variations, may affect melatonin production. By simulating such natural sunlight, productivity of office and other indoor workers may be improved.

Replaceable Module Embodiments

Figure 1:
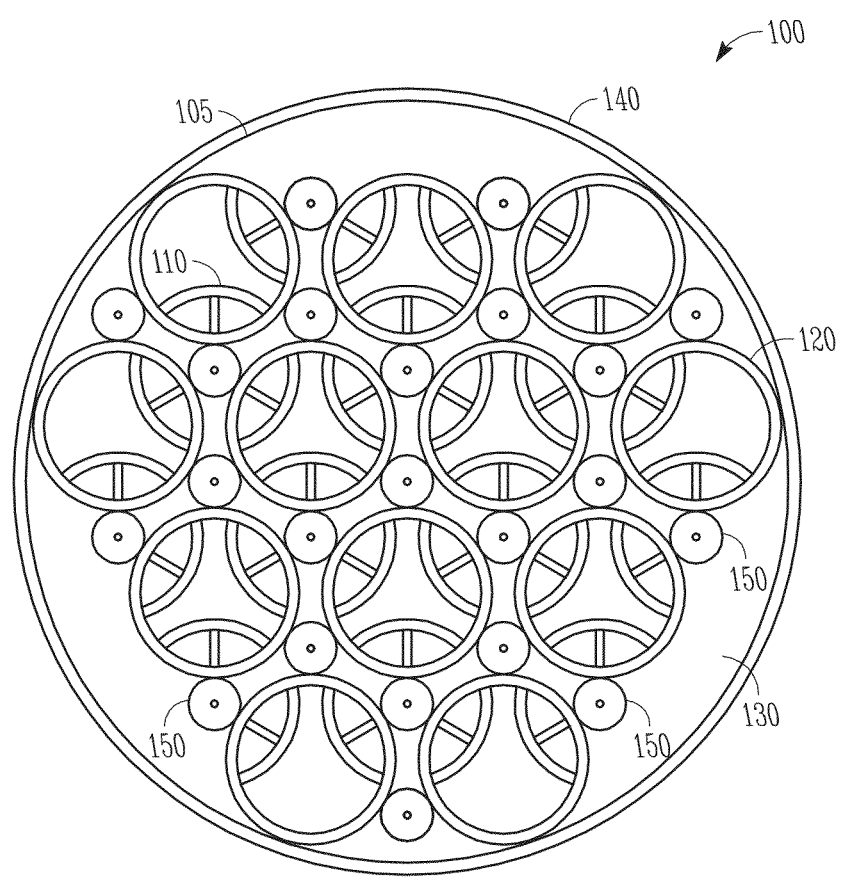
FIG. 1 is a top view of a matrix of light emitting diode modules according to an example embodiment.

In one set of embodiments involving arrays of replaceable light emitting diodes, a high intensity light emitting diode light fixture for producing large volume of light for lighting large areas, such as parking lots, parking ramps, highways, streets, stores, warehouses, gas station canopies, etc., is illustrated in FIG. 1 generally at 100. FIG. 1 is a top view of light fixture 100, which includes a rigid matrix 105. Multiple high intensity light emitting diodes may be encapsulated into modules 110, which may be seen in FIG. 1 through cylindrical cooling structures 120. In this view, the modules provide light pointing away from the surface of the figure.

In one embodiment, the cooling structures 120 and modules 110 are supported by the matrix 105, which is formed of aluminum in one embodiment to provide both strength and heat conduction to help keep the modules 110 cool. A board 130, such as a circuit board, may be placed integrated with the cooling structures 120 and provides appropriate electrical conductors between the modules 110. In one embodiment, board 130 may be a standard circuit board with metallization for forming the conductors. In one embodiment, a frame 140 may be formed around the matrix and be integrated with the matrix.

The matrix and cooling structures 120 may be formed of aluminum or other material that provides adequate structural support, is light weight, and conducts heat well. A plurality of electrical sockets 150 may be formed on the matrix between the cooling structures and are secured to the board 130 in one embodiment, forming a matrix of electrical sockets 150 that may be electrically interconnected in two dimensions by the board 130. One or more light emitting diode modules 110 may be individually removable and replaceable within any individual electrical socket within the matrix, which may be rigid in one embodiment and may be secured within the matrix 105 by an epoxy or other filler material having suitable heat conducting and retentive properties to ensure the board 130 is securely held in place over the sockets 150.

As may be seen in FIG. 1, more sockets than can accommodate modules may be provided in various patterns. The additional sockets provide flexibility for a multitude of lighting needs. In one embodiment, the sockets may provide for the use of an optimum number of modules to provide a high volume of lighting for outdoor applications, such as parking lots, parking ramps, highways, streets, stores, warehouses, gas station canopies. For lower volume lighting applications, fewer modules may be used in fewer sockets. For each configuration of sockets with modules, the electrical connections may be modified to provide a proper voltage for each module.

Figure 2B:
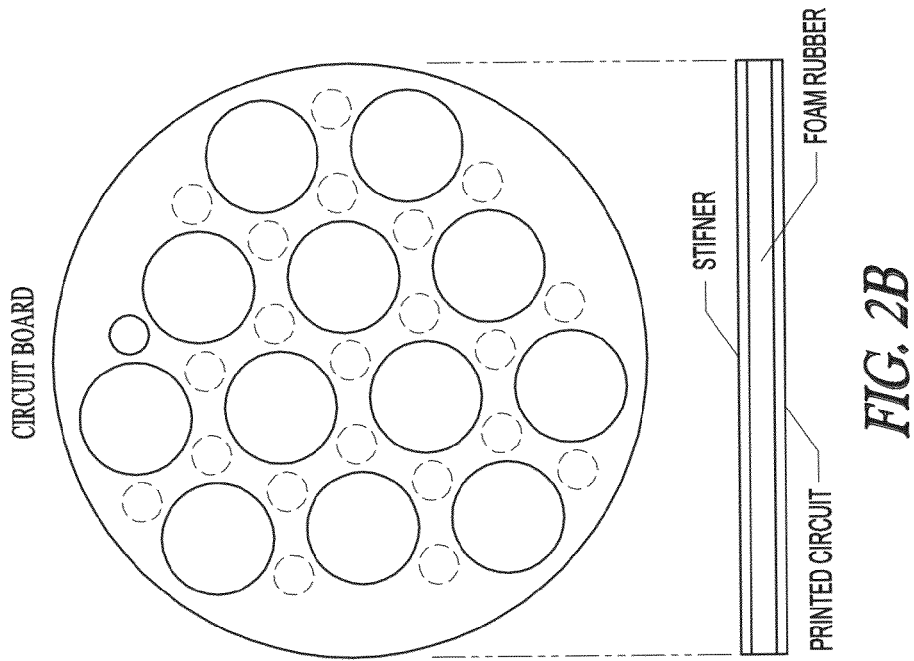
FIG. 2B is a top view of a circuit board for mating with the matrix of FIG. 2B according to an example embodiment.
Figure 2A:
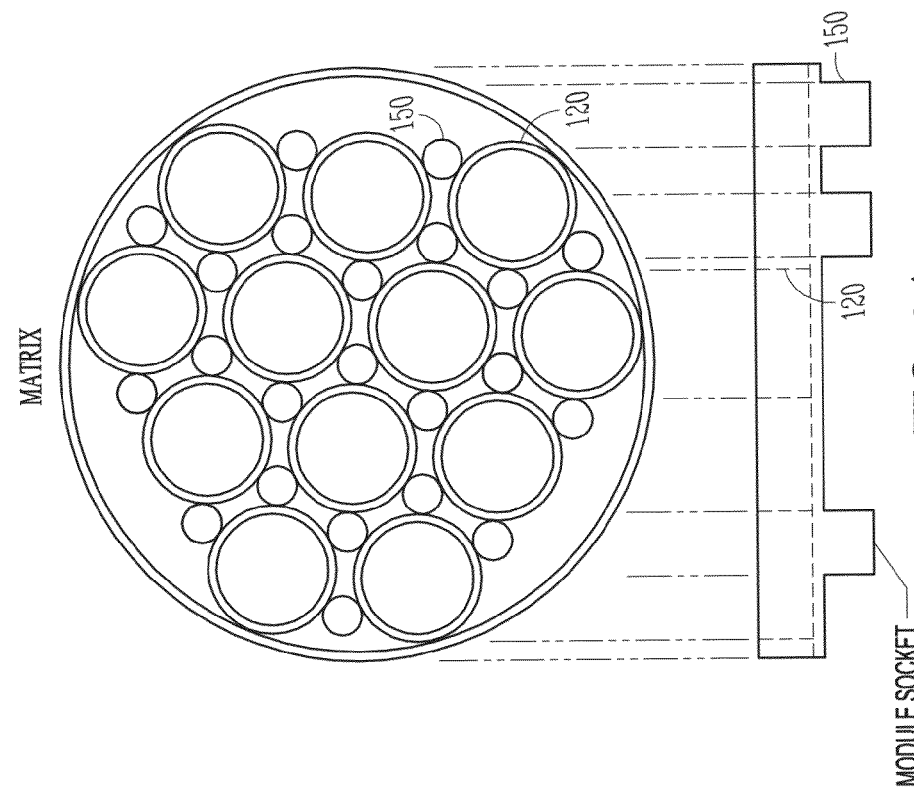
FIG. 2A is a top view of a matrix including sockets for light emitting diode modules according to an example embodiment.

FIG. 2A is a top view of matrix 105 including sockets 150 for light emitting diode modules according to an example embodiment. As shown the matrix 105, with cooling structures 120 and sockets 150 have some depth to them that provides both structural support may be formed of heat conducting material. The sockets are disposed between the cooling structures such that heat is easily conducted to the cooling structures.

FIG. 2B is a top view of circuit board 130 for mating with the matrix of FIG. 2B according to an example embodiment. The board 130 has openings corresponding to cooling structures 120 in one embodiment, and sets of connectors corresponding to the sockets when coupled to the matrix.

Figure 3:
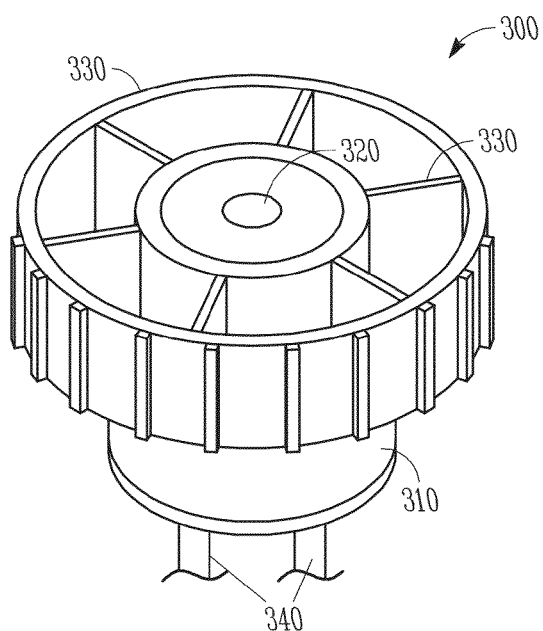
FIG. 3 is a perspective view of a high intensity light emitting diode module according to an example embodiment.

Each individual light emitting diode module as shown in further detail at 300 in FIG. 3 may include a base 310 and a light emitting diode 320. The base may be configured and arranged for fitted electrical engagement within the electrical socket 150. Light emitting diode modules 300 may fit in the electrical sockets 150 though multiple different types of connections. In various embodiments, the light emitting diode 320 may be different colors with most colors being currently commercially available.

The base 310 of the light emitting diode module 300 may include heat dissipating radial fins 330 to dissipate heat away from the electrical socket 150 and leads or contacts 340 for coupling to connectors on board 130 for providing power to the light emitting diode 320. Because the light emitting diode module 300 may be used for both inside and outside applications, some embodiments are able to withstand a large ambient temperature range provided it is not too warm for proper operation, and may also withstand inclement weather conditions including rain, snow, ice, dust, winds up to about 150 miles per hour, etc., while still efficiently emitting light. The heat dissipating fins 330 may extend radially from a top of the base 310, drawing heat away from the light emitting diode 320 and acting as a heat sink to prevent damage to the light emitting diode or the surrounding components. The fins may couple to a heat fin ring 350 which may provide stability and a means of permitting ease of handling when assembling or replacing modules 300 in sockets 150.

Figure 4:
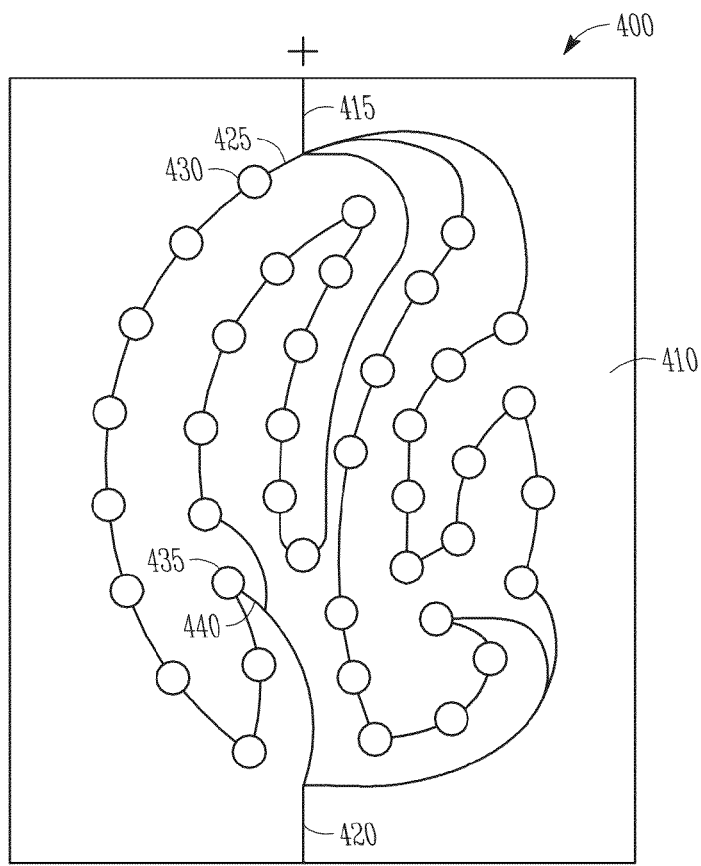
FIG. 4 is block schematic representation of wired sockets for a matrix of modules according to an example embodiment.

FIG. 4 is a block diagram schematic representation of a connector board for a high intensity light emitting diode array shown generally at 400. Openings in the board for the cooling structures are not shown. In one embodiment, a board 410 is provided with a positive connector 415 and a negative connector 420 for connection to a power source and driver, not shown. Positive connector 415 is electrically coupled via a connector 425 to a first socket 430. Given a supply of 24 volts across connectors 415 and 420, ten sockets are serially electrically coupled, ending with socket 435, which in turn, is coupled via connector 440 to negative connector 420. These connections, together with intermediate serial connections to eight other sockets provides a voltage drop of 2.4 volts DC for each light emitting diode plugged into the socket. This ensures that each light emitting diode will receive the proper voltage for proper operation.

If a different supply level is provided, and/or different light emitting diodes are used with different voltage drops, it is a simple matter to divide the supply by the voltage drop to determine how many sockets should be connected serially. The board may then be reconfigured consistent with the number of sockets needed. As shown in FIG. 4, there are four such sets of serially connected sockets, each being coupled between the positive and negative connectors 415 and 420. Many other different configurations are possible.

In still further embodiments, adaptive power supplies may be used, and the number of modules in series may be varied with the supply adapting to the proper output required to drive the modules. All sockets may be active with such drivers and modules plugged in as desired. In some embodiments, modules may be removed or added in series if needed to be compatible with the supply and driver circuitry. All the sockets may be wired in series in one embodiment. Plugs to short circuit open sockets may be used to maintain the series connection, or suitable bypass circuitry may be used to maintain a series connection if modules in sockets have malfunctioned, or sockets are not used in some lighting applications.

In one embodiment, the current sockets are arranged in an oval shape, but many other shapes may be easily used. The board 410 may be suitably shaped to conform to the sockets to provide a shape suitable for aesthetic design purposes. Similarly, the matrix 105 as shown in FIG. 1 may also take many different shapes, from rectangular or circular as shown to just about any shape desired, such as "u" shaped or kidney bean shaped to name a few. Further, elongated shapes of one or more rows of sockets may be provided.

The matrix 105 and board 130 in some embodiments may be made of any weather resistant metal such as aluminum or other material suitable for dissipating heat. In one embodiment, the electrical sockets are in a uniformly disbursed triangular matrix in relation to each other and may be part of a cast matrix 105.

Figure 5:
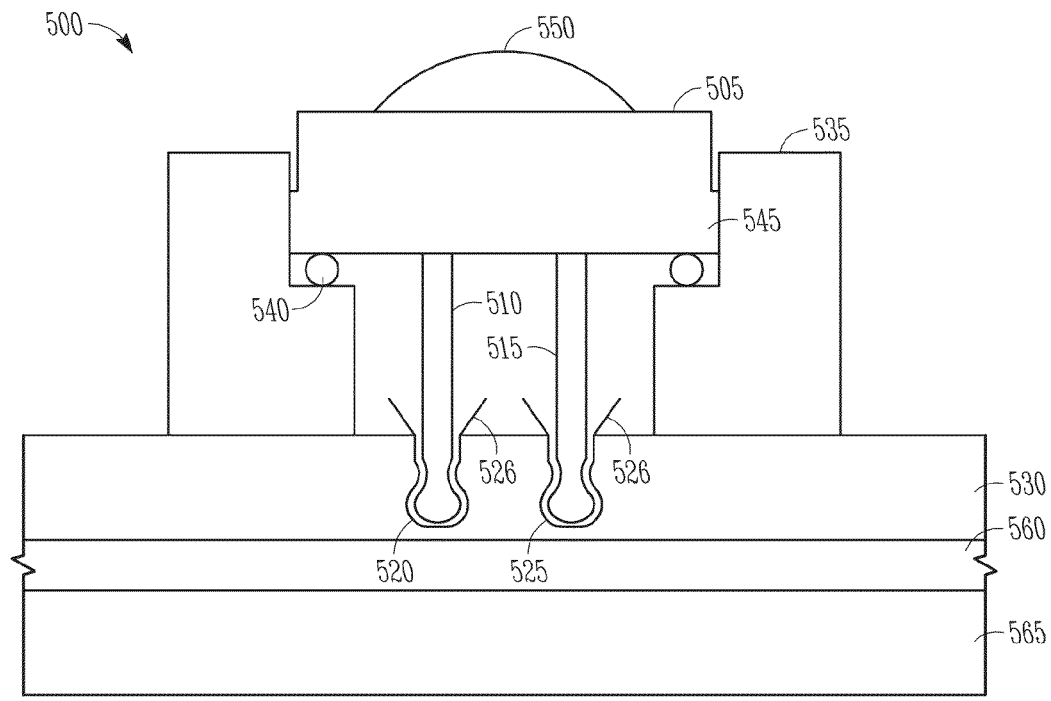
FIG. 5 is a block cross sectional view of a module supported in a socket according to an example embodiment.

In one embodiment, the electrical sockets 150 may be designed to accommodate a removable and replaceable light emitting diode module with different connection types including, but not limited to, screw-in or Edison type connections, a bayonet-type connection, and snap-in or friction connection as illustrated at 500 in FIG. 5.

In FIG. 5, a module 505 is secured via conducting pins 510, 515 into mating connectors 520, 525 in a board 530. The conducting pins and mating connectors provide for a snap-in or friction connection that holds the module 505 securely within a socket 535. In one embodiment, the mating connectors 520 and 525 may be provided with guides 526 that ensure that the pins are properly inserted and guided into the female mating connectors 520, 525, which may be made of brass in one embodiment and be spring loaded from the sides to retentatively engage the pins 510, 515. The female connectors may extend partly above the board, or within the board in various embodiments. When within the board, the board essentially has a larger opening than the diameter of the pins, and narrows to the point of the snap-in or friction connection portion of the matting connectors.

In one embodiment, a sealing member such as a ring, disk or washer 540 is positioned between the module 505 and a surface of the socket 535. The sealing member 540 is compressed when the module 505 is fully secured by the pins and mating connectors to provide a water tight seal and protect the electrical connections from elements which might degrade the electrical contact formed by such connections. In various embodiments, the sealing member may be formed of rubber, latex, Teflon, silicon rubber or like compressible material. To provide for larger tolerances with respect to the thickness of the board 530 and the distance of the connectors 520, 525 from the module when seated in the socket, the compressible sealing member may be formed with a hollow center in some embodiments. In further embodiments, the sealing member operates to provide a seal over a wide depth of compression.

In a further embodiment, plugs may be formed in the same shape as module 505, having pins that mate with the mating connectors 520, 525 to provide a seal around sockets that are not used for operational modules. The pins of such plugs may be electrically isolated from each other to ensure that no short circuits occur, or may provide a short circuit to properly maintain a series connection in a pre-wired string of sockets. Such plugs ensure integrity of all electrical connections in the board when properly used in all sockets not containing modules 505.

The ability to easily remove and replace modules in a sealing manner facilitates maintenance and repair of high intensity large volume matrix lighting solutions. Each individual light emitting diode module may be removed from an individual socket within the matrix. Because the individual light emitting diode modules are individually replaceable, if one module fails there is no need to replace an entire bundle or group of electrical sockets or modules. Simple removal and replacement of the failed module may be quickly performed. Furthermore, light emitting diode modules emitting different colors may be rearranged within the matrix to produce different color arrangements without replacement of the entire bundle of electrical sockets or modules.

Module 505 also illustrates a lens 550 coupled to the light emitting diode within module 505 and providing a protective seal. The lens 550 may be placed on and adhered to a filling material surrounding the actual light emitting diode. As the filling material solidifies, the lens may be securely fastened to the filling material. Many different types and shapes of lenses may be used. For large area high intensity lighting applications, the lens may be shaped to provide directional lighting, or a widely dispersed beam of light such that when all the modules in an array are properly oriented, a desired pattern of light is provided to light a large area, such as a parking lots, parking ramps, highways, streets, stores, warehouses, gas station canopies. Similarly, different lenses may be used for many different applications, such as for forming spot lights, narrow beams from each module may be desired.

Module 505 may also be provided with guides 545, which along with mating guides in a socket, ensure that the module is inserted into the socket in a desired orientation. In one embodiment, the guides 545 may be ridges extending outward from the module and mating with grooves in the module to provide a guide. In further embodiments, the grooves may be on the module with mating ridges on the socket. Many different shapes and combinations of grooves and ridges may be provided in various embodiments.

In yet a further embodiment, board 530 may be formed with a filling material 560, and a further board 565. Such a combination provides a seal for the conductors on the board and protects them from the elements.

Figure 6:
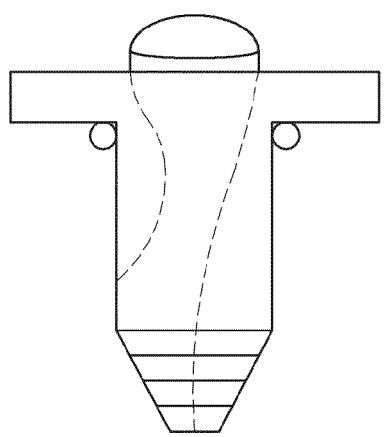
FIG. 6 is a block cross sectional view of a module having a different connection mechanism to provide a sealed connection with a socket according to an example embodiment.

FIG. 6 is a further embodiment 600 of a screw in type of connector, commonly referred to as an Edison connector. A sealing member is also provided. In this embodiment, a simple cylinder may be used as the socket, with the top portion of the module with the sealing member simply compressed against the tope of the socket when the module is fully engaged in a retentive relationship with the socket.

Figure 7:
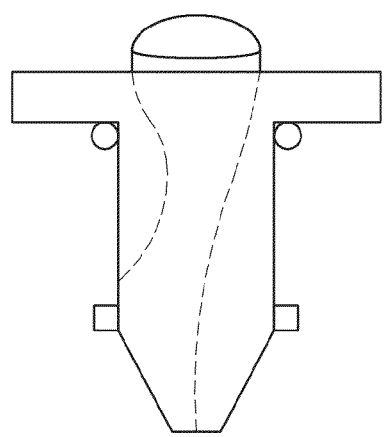
FIG. 7 is a block cross sectional view of a module having a different connection mechanism to provide a sealed connection with a socket according to an example embodiment.

FIG. 7 is a further embodiment 700 of a bayonet type connector, also having a sealing member that is similarly compressed.

Figure 8:
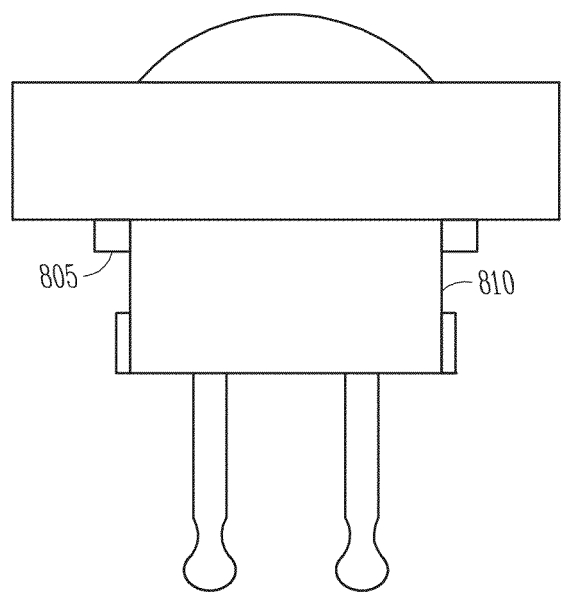
FIG. 8 is a block cross sectional view of a module having a different connection mechanism to provide a sealed connection with a socket according to an example embodiment.

FIG. 8 is an alternative embodiment 800 to the module 505 of FIG. 5, where the sealing member 805 is positioned over the base 810 of module 800. The pins are also similar in that they provide friction fit with connectors on a board.

Figure 9:
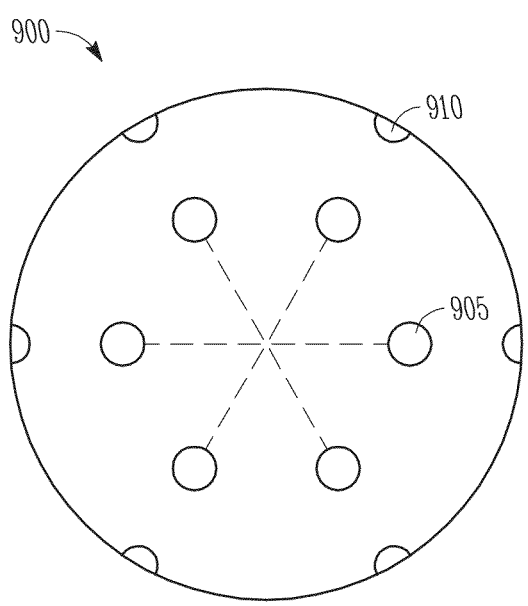
FIG. 9 is a top view of connectors on a board for providing electrical connection to a module according to an example embodiment.

FIG. 9 is a block diagram schematic view of the bottom of a socket 900, into which pins of the modules may be inserted. Six openings 905 are illustrated, representative of connectors for three differently oriented sets of pins. Also shown are grooves for providing a guide so modules are properly inserted. In one embodiment, the board may have three or more different sets of wiring to provide different circuits for different types of LED modules, such as different color LEDs. The different circuits may then be used to independently control the different color LEDs in a desired manner, and as further discussed below to provide different color and intensity light. The differently oriented sets of pins along with grooves in one embodiment are formed to ensure that a light of one color may only be plugged into a socket in a desired manner to connect to the desired circuit. In further embodiments, signals to control of lights may be multiplexed onto one or more control lines to provide separate circuits for desired control of lights without having to plug them into the socket in different alignments. Still further, sockets may be prewired for a certain type of LED module. In still further embodiments, sockets may be twisted or otherwise oriented within a socket to make contact to a desired circuit.

In one embodiment, a circuit board may have 120 available sockets for modules, to allow flexibility in positioning modules. In some embodiments, different types of modules, such as different color modules may be interspersed throughout the board. In one example, 90 white light modules, and 30 yellow light modules may be properly inserted into sockets and independently controllable, either by separate circuits, or predetermined wiring. Many other different combinations and total numbers of sockets per circuit board may be used in further embodiments, including boards that support 60 to 90 sockets, 90 to 120 sockets, and 120-160 sockets for example.

Figure 10:
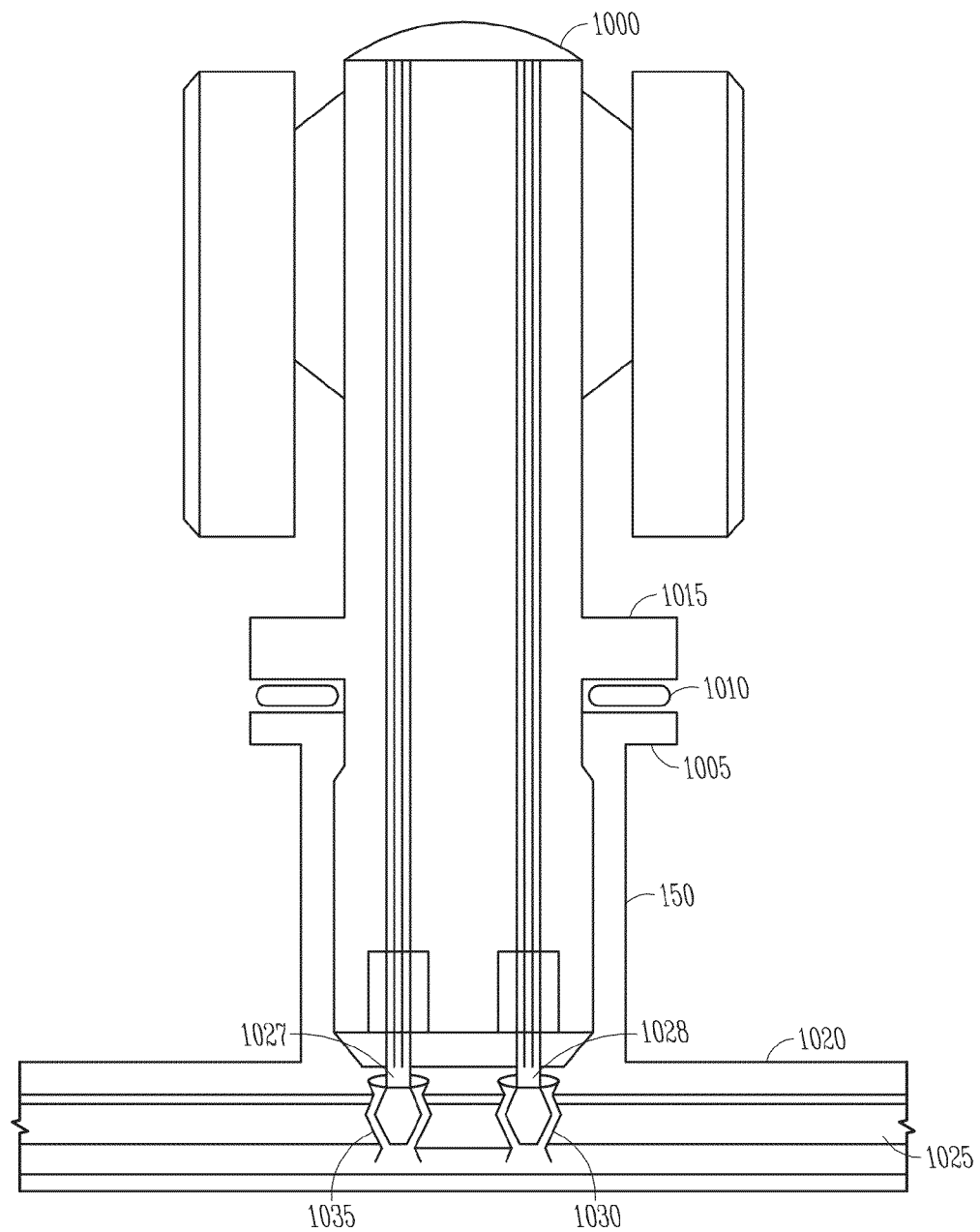
FIG. 10 is a block cross section view of an alternative module supported in a socket according to an example embodiment.

FIG. 10 is an alternative embodiment of a module 1000 plugged into a socket 150. In this embodiment, socket 150 has a flange 1005 at a module receiving end that operates to provide a surface for compression of sealing material 1010 between flange 1005 and a ring 1015 formed on a base of module 1000. Socket 150 also has a second flange 1020 formed on a second end that abuts board 1025. In this embodiment, pins 1027, 1028 extend a short distance from a body 1030 of module 1000 to mate with female connectors 1035 and 1040. The female connectors 1035, 1040 may extend beyond the circuit board into the compressible adhesive material 1045 in some embodiments.

Figure 11:
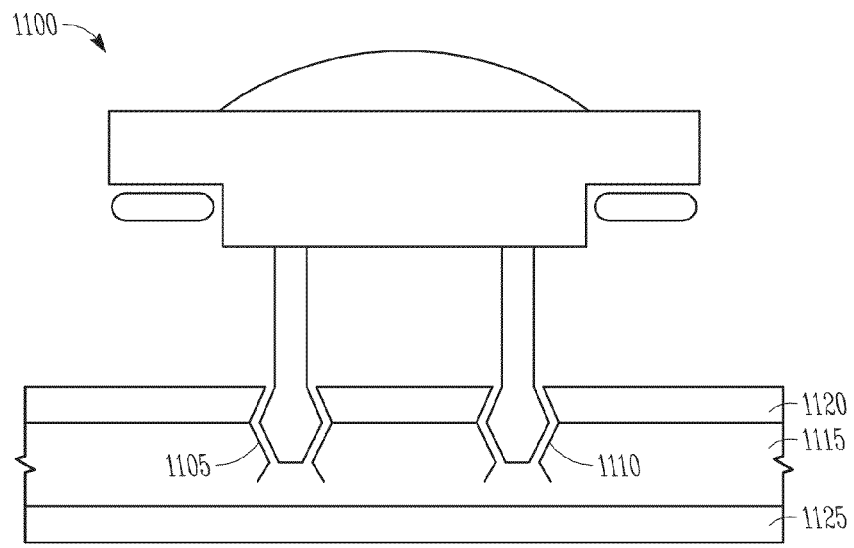
FIG. 11 is a block cross section view of an alternative module for plugging into a board according to an example embodiment.

FIG. 11 shows an alternative module 1100, wherein the female connectors 1105 and 1110 extend significantly into a compliant adhesive material 1115 between boards 1120 and 1125. The material 1115 provides additional spring force for maintaining retentive force on the pins via female connectors 1105 and 1110. In one embodiment, the material 1115 may be a liquid rubber, latex, or silicon type material that is pliable and provides good adhesion over the boards.

Figure 12:
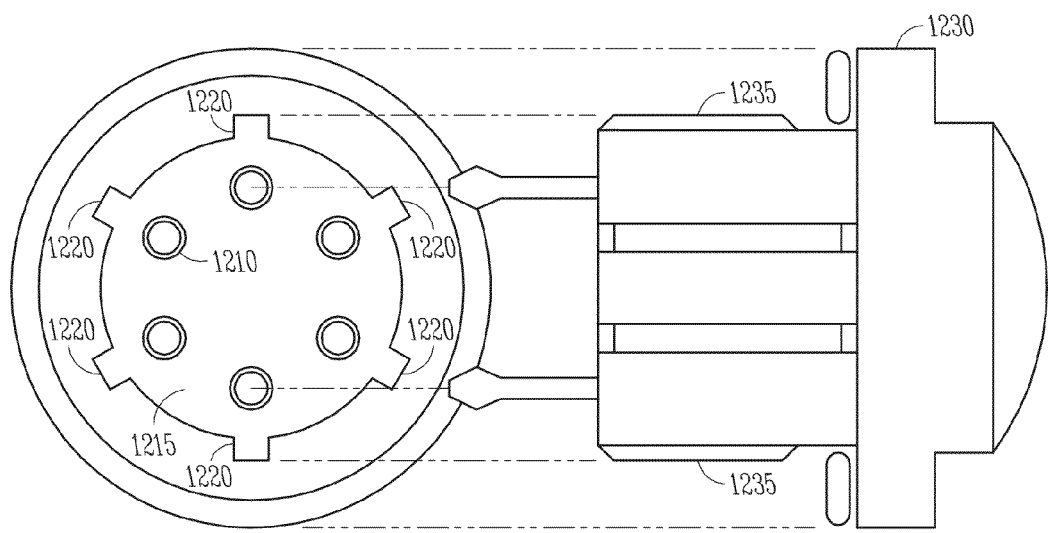
FIG. 12 is a top view of a connector and side view of a module for plugging into the connector according to a further example embodiment.

FIG. 12 is a top view of multiple sets of female connectors 1210 on a board 1215 for mating with pins of a module 1230. Grooves 1220 are also provided in the sides of the socket corresponding to the connectors to provide for guiding the module 1230 having a pair of mating ridges 1235. In one embodiment, the module may be coupled to one of three different sets of connectors by rotating the module and inserting it. The positions in which the module may be inserted may be referred to as A, B and C in one embodiment. Position A may correspond to wiring on the board such that 80 modules may be inserted into sockets to provide lighting for an application requiring that amount of light. Position B may accommodate 120 modules, while position C may accommodate 160 modules. The particular numbers of modules may be varied considerably in different embodiments. In one embodiment, two grooves 1220 may be provided, and rotated to different positions to ensure that the module is properly inserted depending on the application desired. Templates may also be used for each different configuration to help a user insert modules into the proper sockets. After use of the template, the remaining open sockets may have plugs inserted to ensure that the lighting fixture is properly sealed.

Light Programs

The functions or algorithms described herein may be implemented in software or a combination of software and human implemented procedures in one embodiment. The software may consist of computer executable instructions stored on computer readable media such as memory or other type of storage devices. Further, such functions correspond to modules, which are software, hardware, firmware or any combination thereof. Multiple functions may be performed in one or more modules as desired, and the embodiments described are merely examples. The software may be executed on a digital signal processor, ASIC, microprocessor, or other type of processor operating on a computer system, such as a personal computer, server or other computer system.

In various embodiments of the present invention, one or more light programs are used to control both the color and intensity of light emitted from one or more arrays of light emitting diode (LED) lights. In one embodiment, light color and intensity may be measured in an outdoor setting over the course of a day from morning to evening. Both the color, as measured on a Kelvin temperature scale, and a photometer are used to digitally measure light color and intensity over the course of the day. In one embodiment, several such days are recorded. Seven days worth of such light days may be recorded in one embodiment and then serially or randomly used to control the LED lights in an indoor space, such as an office. Such days may include clouds, such as cumulus clouds drifting across the sun, adding more variety and comfort to the light pattern experienced by occupants of the indoor space.

In one embodiment, the intensity of the light may be maintained at a desired sufficient level to facilitate office work. A threshold may be set to override periods when the recorded day that may dip below the threshold. For instance, a thick cloud may obscure a significant amount of sunlight, bringing the light intensity during playback of the recording to a level below a desired level and interfere with working. The threshold may be used to increase the brightness, modify the color, or both, to ensure a level of light that does not interfere with work. The threshold may further be adjusted to levels that promote a feeling of well being, while remaining above an ergonomically acceptable level.

The changes in light level in one embodiment, may be fairly subtle so that it is usually only subconsciously apparent. By removing extremes, the changes in light are not annoying, but rather may have a calming or relaxing effect on humans.

Kelvin temperature is a numerical measurement that describes the color appearance of the light produced by a light source, and the color appearance of the light source itself, expressed on the Kelvin (K) scale.

In application, the Kelvin temperature of light sources is used to categorize them as warm, neutral or cool sources. The terms are not directly related to temperature; instead, they describe how the light source appears visually. Warm sources actually have a lower color temperature (3500K or less), producing a red-yellow appearance similar to natural morning light. Neutral sources (between 3500K and 4100K) tend to have a yellow appearance. A light source with a color temperature of 5000K is considered pure white light (Full Spectrum) with the lamp becoming more blue in color as the color temperature is increased.

Warm light sources are traditionally used for applications where warm colors or earth tones dominate the environment, and where there is a need to impart a feeling of comfort, coziness and relaxation. Cool light sources (5000K to 7000K+) provide a white light, similar to full daylight. In prior lighting arrangements, such white light has been associated with increased productivity and reduced errors within an office environment.

Figure 13:
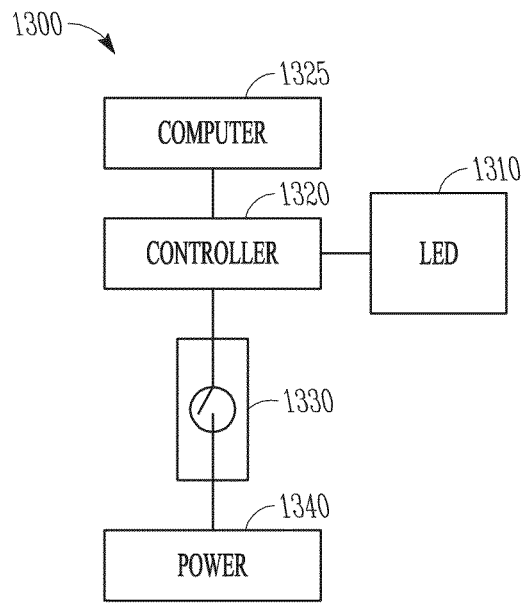
FIG. 13 is a block diagram of a lighting system according to an example embodiment.

An example lighting system is illustrated in block form in FIG. 13 at 1300. A light fixture, such as a light emitting diode (LED) array 1310 contains sets of LEDs adapted to emit at least two different colors of light. In one example embodiment, the colors correspond to approximately greater than 3000K, generally yellow, and approximately less than 7000K, generally white. The actual Kelvin values may vary in different embodiments to better approximate desired colors. Values above about 3000K generally are yellow, with some red. They may be referred to as being warm colors. Values less that about 7000K generally are white, and also contain some blue, and are referred to as corresponding to cool colors.

While most of the description herein refers to LEDs, other lights now known or hereafter discovered that produce different colors may also be used. In one embodiment, by controlling the intensity of each color light, a light of about 5000K produces a white light that is advantageous for highway lighting. A range of about 4000K to 4500K produces a slightly yellower light, which may be used to provide a softer light useful for lighting a streetscape (the appearance or view of a street) which is antique in style. The lighting may be controlled to produce a desired color and intensity for creating different lighting conditions suitable for the design of street and buildings being lighted. It provides a flexible tool for setting hues of light to match a desired atmosphere for the design or streetscaping of the street and buildings.

A controller 1320 is operatively coupled to fixture 1310, and controls both the intensity of the sets of LEDs, and also allows selection of a range of colors, by increasing or decreasing the relative intensity of each of the different colors of lights. In one embodiment, controller 1320 has one or more day programs to replicate the color and intensity of outside light during one or more typical or desired days. The controller 1320 may be coupled to a computer 1325 in one embodiment to facilitate downloading of day programs, user generated programs, and to allow selection of a day program to run, or in further embodiments, may cycle through several day programs over the course of a week or more. In some embodiments, it is desirable not to repeat a five day sequence of lighting each week, but rather to vary it from week to week to avoid monotonous repetition. Having more than five days of recording or programming, or including randomness to the selection of a program for each day or week may further enhance the effectiveness of the lighting.

A switch 1330 may be provided to turn the fixture 1310 on and off as with a standard lighting system. Power is indicated at 1340, and may be coupled to the grid, or other power source as desired.

In one embodiment, the fixture 1310 comprises a matrix of sockets coupled to a circuit board as described above with respect to FIGS. 1-12. The circuit board may support the controller 1320 which is coupled to multiple circuits for controlling LEDs for different color. In one embodiment, a first circuit may correspond to control of white LED modules, and a second circuit may control yellow LED modules. Still further, a third circuit may be used for driving all the LED modules. The controller may thus control Kelvin color by balancing between yellow and white led. With an additional photo sensor, the controller 1320 may control dimming as a function of brightness of day, and also provide on/off control.

Figure 14:
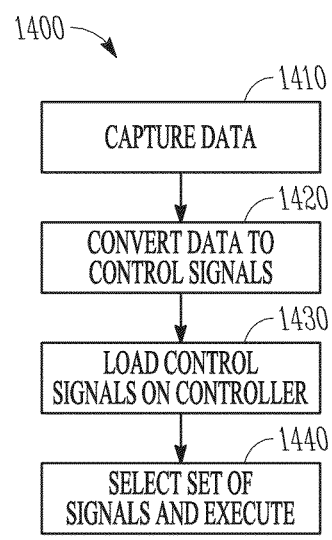
FIG. 14 is a flow chart illustrating a method of collecting data according to an example embodiment.

FIG. 14 is a flowchart illustrating a method 1400 of collection data to form one or more day programs. In one embodiment, data is captured at 1410 using a Kelvin meter and a photometer to capture both the color of light and the intensity of the light. The data may be captured in an outdoor location over the course of a day. The data may include changes caused by the sun changing its angle in the sky, from low during the morning, producing warmer color tones to mid day, with commensurately higher intensity and cooler color tones, to late afternoon, again producing warmer color tones and lower intensity. The data may also include changes due to different clouds moving past the sun, producing somewhat random changes to warmer, lower intensity periods as a cloud passes. Several different days of data may be collected to form many different programs. In one embodiment, seven such programs may be formed from different days of collected data.

In further embodiments, a program may be generated by a person, or from random events. Different types of cloud passings may be recorded, and used randomly in the generation of such programs and overlayed on data corresponding to a typical cloudless day. In one embodiment, during playback, cloud passings may be played back to appear as a cloud moving overhead in a room. The LED modules may be controlled individually or in groups to give the appearance of the cloud passing by the sun and partially obscuring light from the sun. The cloud may appear to progress from one side of the room to the other. Many such cloud passings may be recorded during a day being recorded. As indicated above, if a cloud is too thick such that it obscures too much light, a minimum threshold for both intensity and color may be used to ensure the program provides adequate light for a work environment at all times. Similarly, a maximum intensity threshold may be used to ensure that the light does not become too bright during playback. In some embodiments, care may be taken to ensure that mostly sunny days are recorded, as a cloudy day may not provide relaxing variations in light as compared to days with occasional clouds passing by the sun. In further embodiments, a desired color or temperature range may also be maintained by providing minimum and maximum temperature thresholds for control of the lights. Many other methods of generating programs may also be used to create simulated daylight programs.

At 1420, the data may be converted to control signals for the controller to use in controlling light. The control signals may include an intensity for each color of light in order to control the overall color of light and an overall intensity for a selected period of time. In one embodiment, the selected period of time may be varied from several seconds or minutes, to less than a second.

At 1430, the control signals are loaded into the controller 1320. A set of control signals corresponding to a desired day is selected at 1440, such as by running them in sequence, or as selected by a user, and the signals are executed.

In a further embodiment, multiple Kelvin meters and photometers may be used to collect light over a space consistent with a space to be lit. In other words, if a room with a certain area is to be lit by multiple fixtures, such as LED arrays or panels, meters may be placed in the same pattern as the fixtures will be arranged. A day program may thus consist of a separate program for each of the fixtures corresponding to the captured data at positioned correlated with the respective fixtures. Thus, a cloud moving past the sun will result in each of the different fixtures being controlled slightly differently at the same time, producing a more realistic feeling of being outdoors.

In still further embodiments, the sensors may be collecting data in real time, and the resulting program being provided directly to the controller to control lighting conditions such that they track the daylight variations occurring. In one embodiment, the sensors may be located just outside an office or other space having a window, such that the lighting within the room is controlled to track the conditions visible outside the room with as little delay as possible. Digital data collection, computing and data transfer capabilities allow for collection of data and execution of the resulting program with very little delay, such that the delay is not perceivable to an occupant.

Figure 15:
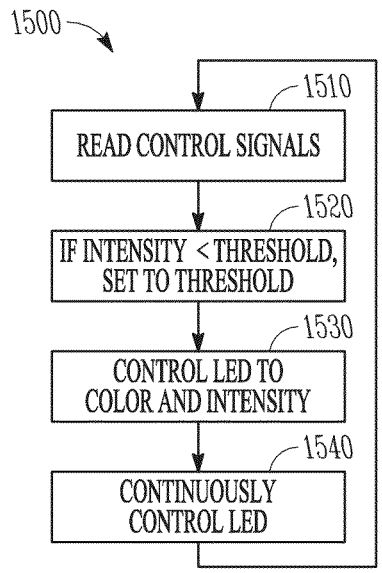
FIG. 15 is a flow chart illustrating a method of controlling the lighting system corresponding to the collected data according to an example embodiment.

FIG. 15 is a flowchart illustrating a method 1500 of running programs in the controller in an example embodiment. The control signals are read at 1510. If the overall intensity is less than a threshold, the intensity is set to the threshold, or another value above the threshold if desired at 1520. The overall color of the light need not be modified unless the intensity is still too low, in which case one of the colors is already at maximum, and the other color LEDs need to be increased in intensity. The threshold may be selected to ensure proper lighting per regulatory requirements, or as otherwise desired according to personal or ergonomic recommendations. The threshold may be selected via computer 1325 in one embodiment, or a control may be provided at the switch 1330 or some other controller, such as a remote control (also represented with reference number 1325), which may also be used to override programming to provide either a different program, or a constant intensity of light at a selected color. In a further embodiment, a high intensity threshold is set to ensure that light intensity does not exceed a desired level. In one embodiment, the light intensity of a program may be normalized or otherwise adjusted between a desired high and low level to ensure that proper working conditions are maintained for the duration of the day program.

At 1530, the fixture 1310 is controlled to the color and intensity identified in the day program for the selected period of time. As indicated, the overall intensity is a function of the combination of light produced from each set of different colored LEDs. At 1540, following the predetermined period of time, a next set of control signals is read from the day program and executed.

Figure 16:
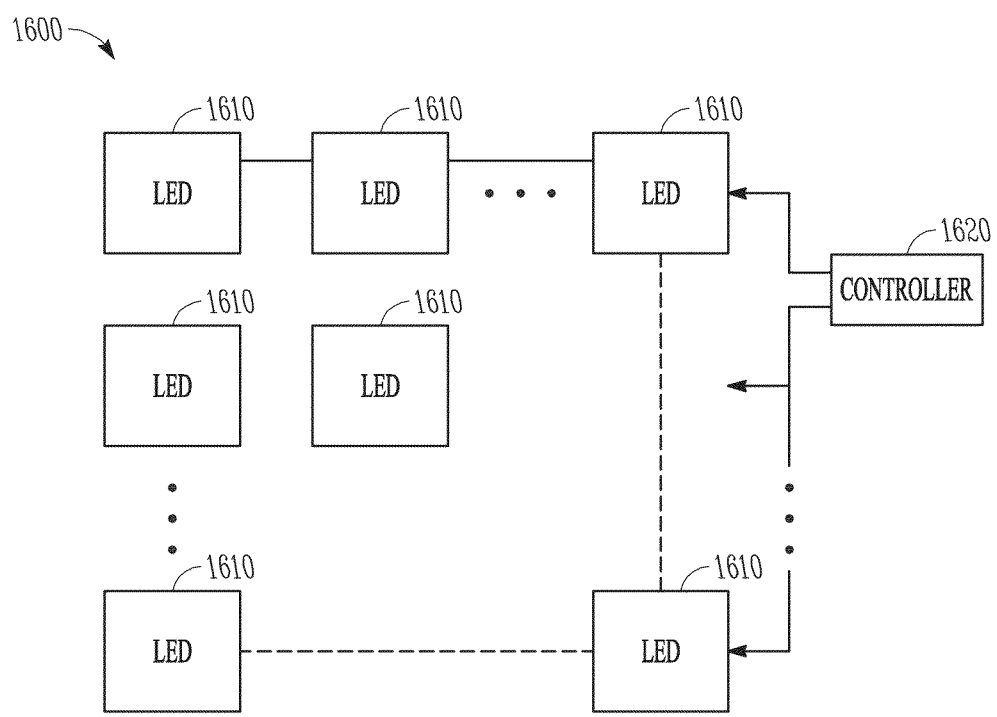
FIG. 16 is a block diagram of a lighting system having multiple light arrays according to an example embodiment.

FIG. 16 is a block diagram of an array 1600 of fixtures 1610. Each fixture is controlled by a controller 1620. A master controller 1620 may be used to control each fixture 1610, or in a further embodiment, each fixture 1610 has its own controller synchronized with the other controllers. In one embodiment, controller 1620 runs a day program that includes individual control signals for each of the fixtures. Such individual control signals may be formed from data collected from multiple meters as described in an alternative embodiment with respect to FIG. 14. Thus, the array of fixtures will more accurately simulate a day outside. In a further embodiment, a single control signals is provided in the day program, but it may be staggered by the controller such that it is applied in a manner that approximates events, such as cloud passings. For instance, the control signals may be staggered such that it is delayed between a first fixture or set of fixtures and a last fixture or set of fixtures in an array a matter of seconds or less. The delay may be varied significantly in further embodiments.

With the lighting system embodiments described, lighting can be made to cause a drifting effect sensation as if clouds were actually passing across the ceiling of an office from one fixture to the next, causing gentle movement of the light intensity at the same time the Kelvin color of the light is changing from a yellower color in the morning to its peak brightness of white in the middle of the day, when natural sunlight is strongest. As the day progresses toward evening, more yellow color appears again. Many subtle changes in the quality of the light provide stress relief that a human may need to feel comfortable in the workplace. It has been only one hundred years or so that humans have spent the majority of our day inside, under artificial light that was devised to take the sun's place and extend our day. It has been tens of thousands of years that humans have spent under the sun, genetically developing in accordance with the changes that occur in outdoor lighting conditions. Modifying indoor lighting to match or simulate such outdoor daylight conditions may be better suited to the evolved human.

Figure 17:
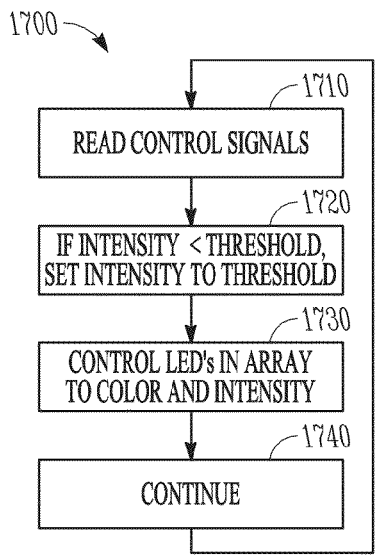
FIG. 17 is a flow chart illustrating a method of controlling the lighting system having multiple light arrays according to an example embodiment.

FIG. 17 is a flow chart illustrating a method 1700 of controlling the array of fixtures 1610 in accordance with programs in the controller in an example embodiment. The control signals are read at 1710. If the overall intensity is less than a threshold, the intensity is set to the threshold, or another value above the threshold if desired at 1720. The overall color of the light need not be modified unless the intensity is still too low, in which case one of the colors is already at maximum, and the other color LEDs need to be increased in intensity. The threshold may be selected to ensure proper lighting per regulatory requirements, or as otherwise desired according to personal or ergonomic recommendations. The threshold may be selected via computer 1325 in one embodiment, or a control may be provided at the switch 1330 or some other controller, such as a remote control (also represented with reference number 1325), which may also be used to override programming to provide either a different program, or a constant intensity of light at a selected color.

At 1730, the fixtures 1610 are controlled to the color and intensity identified in the day program for the selected period of time. As indicated, the overall intensity is a function of the combination of light produced from each set of different colored LEDs, and as either recorded by an array of sensors, or staggered between fixtures 1610 as described above. At 1740, following the predetermined period of time, a next set of control signals is read from the day program and executed.

In one embodiment, each fixture 1610 may have multiple color LEDs that are independently controllable. In further embodiments, an array of fixtures 410 may be used, with each fixture array 1610 having LEDs that emit a single color. The fixtures may then be interspersed with different color fixtures 1610, and controlled such that the overall array provides the desired color and intensity of light according to a day program.

In one embodiment, a photometer may be used to measure the intensity of light emitted from the fixtures to provide a feedback signal to account for a subtle decrease in intensity of LEDs or other types of lights in the fixtures over their life. Thus, even though the LEDs are aging and producing less light, the light provided by them is still in accordance with the programming. If the LEDs cannot produce the desired intensity, an indication may be provided to inform that one or more LEDs may need replacing.

Figure 18:
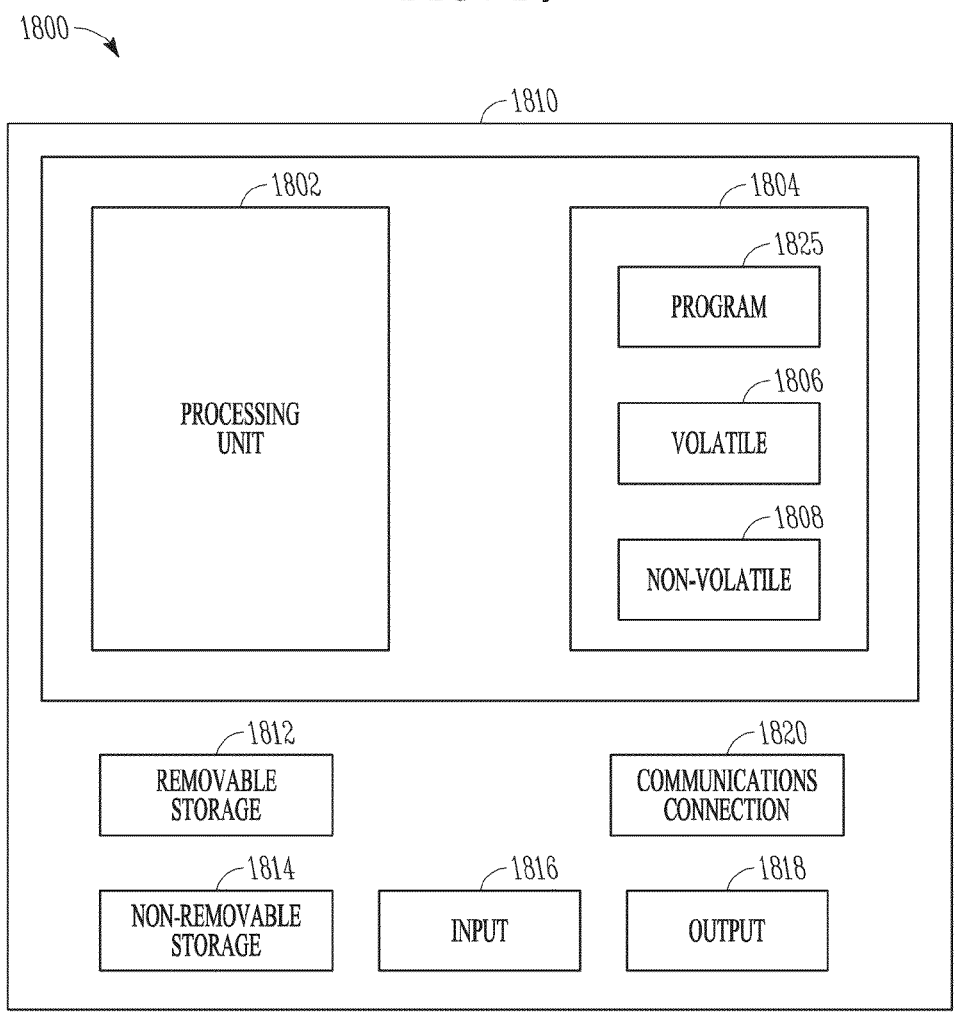
FIG. 18 is a block diagram of an example computer system for implementing one or more methods according to an example embodiment.

A block diagram of a computer system that executes programming for performing one or more of the above algorithms and allowing networking is shown in FIG. 18. A general computing device in the form of a computer 1810, may include a processing unit 1802, memory 1804, removable storage 1812, and non-removable storage 1814. Memory 1804 may include volatile memory 1806 and non-volatile memory 1808. Computer 1810 may include—or have access to a computing environment that includes—a variety of computer-readable media, such as volatile memory 1806 and non-volatile memory 1808, removable storage 1812 and non-removable storage 1814. Computer storage includes random access memory (RAM), read only memory (ROM), erasable programmable read-only memory (EPROM) & electrically erasable programmable read-only memory (EEPROM), flash memory or other memory technologies, compact disc read-only memory (CD ROM), Digital Versatile Disks (DVD) or other optical disk storage, magnetic cassettes, magnetic tape, magnetic disk storage or other magnetic storage devices, or any other medium capable of storing computer-readable instructions. Computer 1810 may include or have access to a computing environment that includes input 1816, output 1818, and a communication connection 1820. The computer may operate in a networked environment using a communication connection to connect to one or more remote computers. The remote computer may include a personal computer (PC), server, router, network PC, a peer device or other common network node, or the like. The communication connection may include a Local Area Network (LAN), a Wide Area Network (WAN) or other networks.

Computer-readable instructions stored on a computer-readable medium are executable by the processing unit 1802 of the computer 1810. A hard drive, CD-ROM, and RAM are some examples of articles including a computer-readable medium.

Networked Lighting for Maintenance

Figure 19:
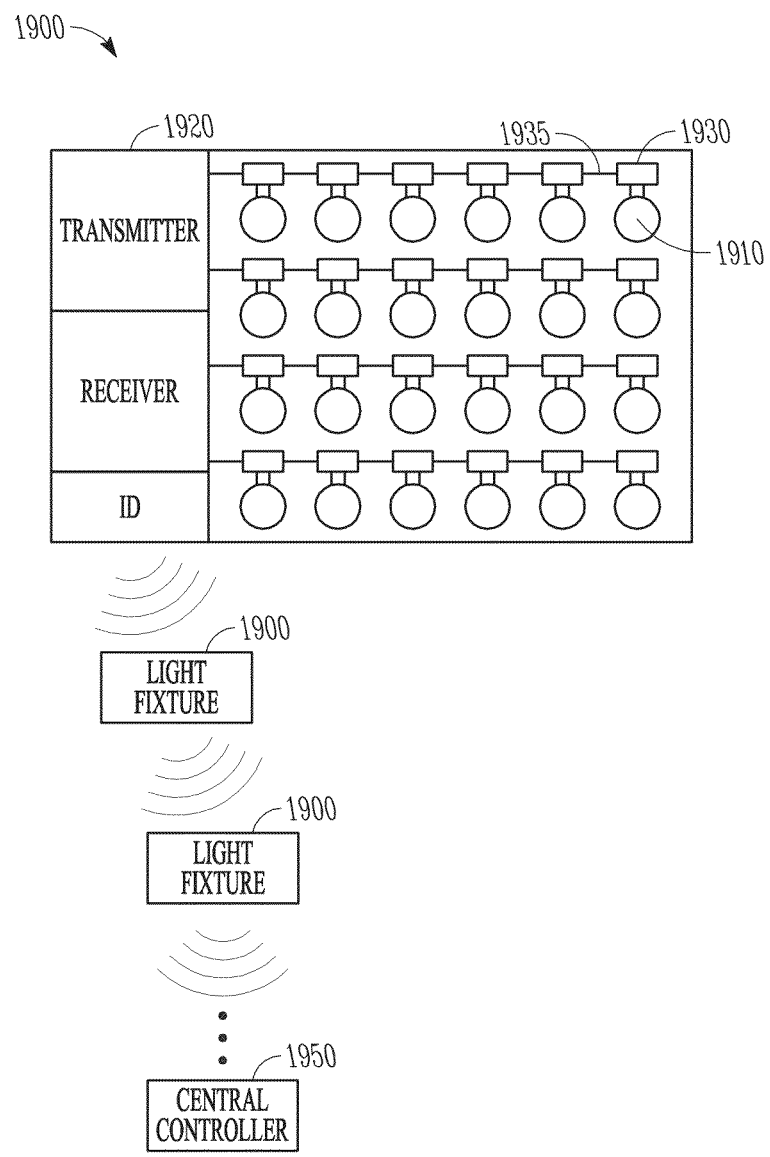
FIG. 19 is a block diagram of a light fixture that provides communications related to light replacement according to an example embodiment.

FIG. 19 is a block diagram of a light fixture 1900, that includes multiple LED lights 1910, and a transceiver 1920. As described above with respect to FIGS. 1-12, the light fixture may include a circuit board having multiple sockets with LED modules (lights 1910), as well as circuits using flexible wire connections to provide power and control to the modules. In one embodiment, the LED modules may be formed of Nichi chips that provide 100 lumens per watt, model number NS6WO83B. The transceiver 1920 may be supported on the circuit board, such as a silver pcb board, and may include control functions for controlling the modules, which may include different color lights 1910 to provide desired colors and intensity of lighting to facilitate streetscaping or other goals to be accomplished by lighting.

In one embodiment, each light 1910 is coupled to a circuit 1930 that receives power for the light and is capable of passing power to a next light to bypass a burned out or inoperative light. Further, the circuits 1930 are coupled to each other via one or more busses 1935 to pass an indication that an associated light, such as an LED module, is inoperative. The indications are received by transceiver 1920, which contains logic and a communication protocol to transmit information indicating that a light is inoperative. An ID may be stored at 1940 for inclusion in the transmitted information. The ID for the light fixture 1900 may be used to uniquely identify each light fixture 1900 from several to several thousand or more light fixtures being maintained.

In one embodiment, the transceiver 1920 is operable to receive transmitted information from other transceivers 1920 being maintained, and pass the received information to a series of other transceivers in further light fixtures being maintained. The transceiver 1920 may utilize RF, WIFI or other communication protocols.

In one embodiment, the information is accumulated at a central controller 1950. Central controller 1950 accumulates the transmitted information and may be used to generate a list of light fixtures needing lights replaced. In one embodiment, the ID information of the light fixtures is correlated to a specific location for the light fixture and may also be correlated with the types of lights needing replacement, such as different color LEDs in module form. The central controller 1950 may provide the list of light fixtures with corresponding lights needed to be replaced at each light fixture. The list may be in electronic form or printed form. In electronic form, it may be viewed on a hand held device which may also be used to navigate to the corresponding light fixture. The list may be ordered for efficient routes to follow in performing maintenance.

In one embodiment, the particular light needing replacement within the fixture may be identified, allowing easy identification on site, without having to inspect the lights in the light fixture in an attempt to determine which light needs to be replaced. Such attempts may have involved turning on the light fixture, and wearing sunglasses or other protective eyewear to view the very bright LEDs to determine the location of the inoperative LED.

Figure 20:
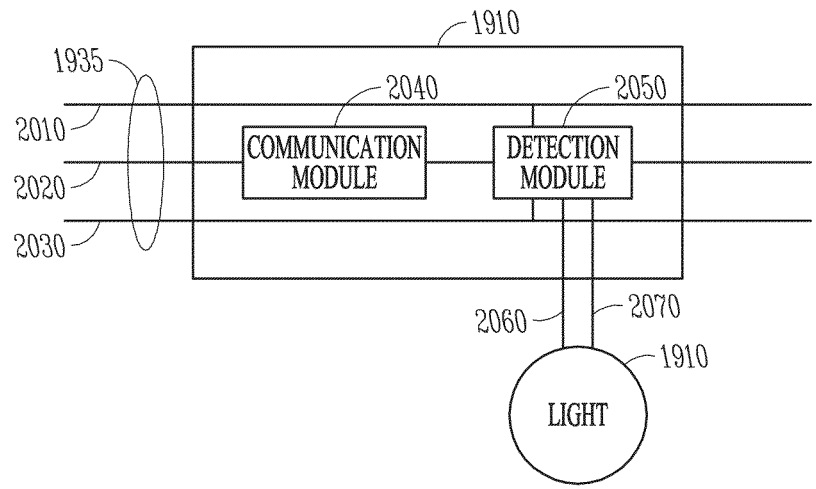
FIG. 20 is a block circuit diagram illustrating a light socket with detection circuitry according to an example embodiment.

FIG. 20 is a block circuit diagram of an example circuit 1930. In one embodiment, bus 1935 includes a power line 2010, a ground line 2030, and a communications line 2020. The communications line is coupled to a communications module 2040, which in one embodiment contains information identifying a location of the light 1910 to which the circuit 1930 is attached. Communications module 2040 is coupled to a supply and detection module 2050, which in coupled to power the light via lines 2060 and 2070. The detection module decouples the light from line 2060 and 2070 when the light presents a short circuit so that other lights in the light fixture may continue to receive power. Detection module 2050 indicates to communications module 2040 that the light is inoperative, either by detection of a short, or an open circuit, or otherwise inappropriate power demands of the light 1910. In further embodiments, separate communication lines may be provided to each circuit 1930 such that logic within the transceiver can identify the location of an inoperative light by correlating one or more communication lines with locations of the inoperative lights in the array of lights. This simplifies the circuitry further, decreasing overall costs of the light fixture.

Figure 21:
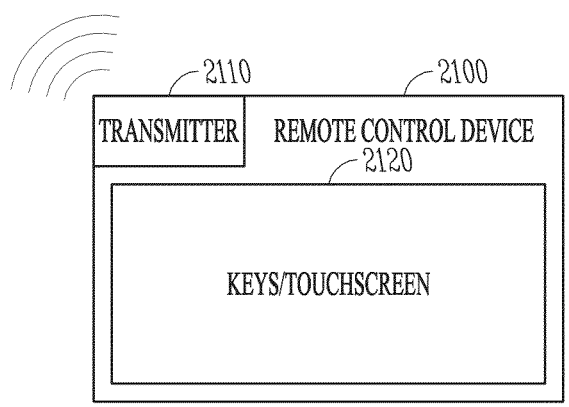
FIG. 21 is a block diagram of a remote control device for programming light fixtures according to an example embodiment.
Figure 22:
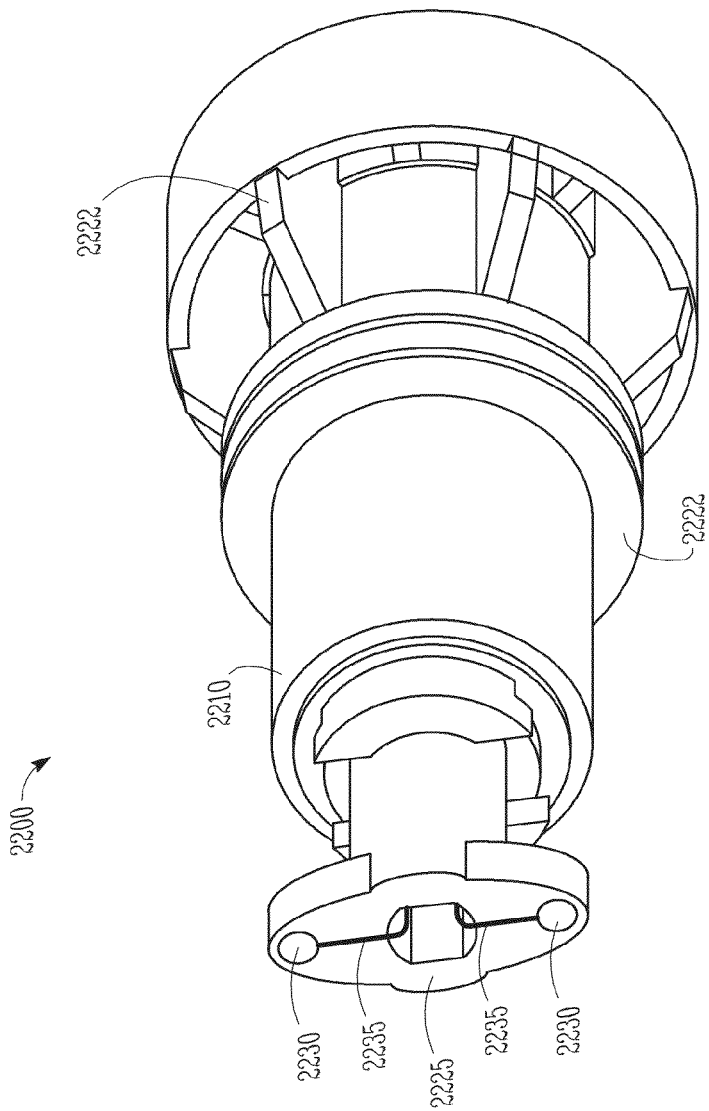
FIGS. 22, 23, 24, and 25 illustrate perspective views of a light module and various aspects of a light fixture that utilizes replaceable light modules according to example embodiments.
Figure 23:
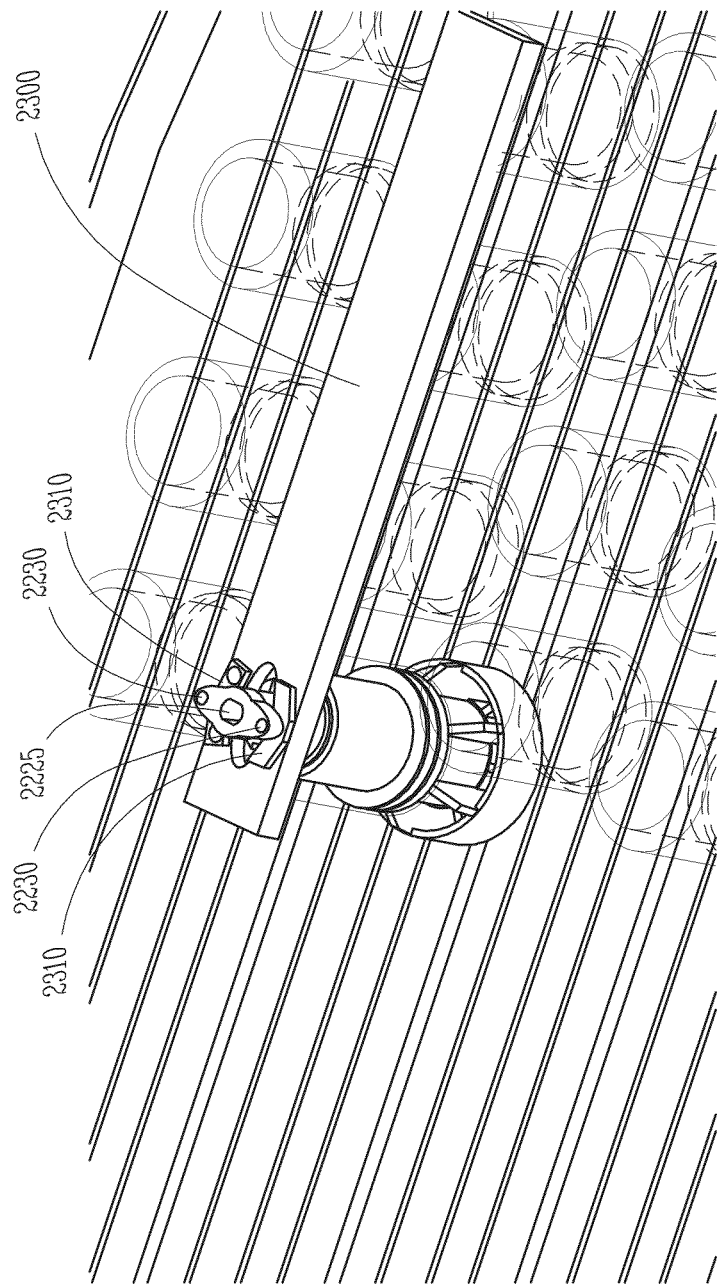

FIG. 21 is a block diagram of a remote control device 2100. Control device 2100 includes a transceiver 2110 that communicates directly with a local light fixture, or to the central controller, either directly, or through a network of light fixtures having transceivers as described above. The control device 2100 in one embodiment has a data entry devices, such as keys or touchscreen 2120, that allows a user to select a light fixture to control. A GPS unit may provide location information, which when provided to the central controller, causes the central controller to display light fixture proximate the location of the remote control device 2100.

The remote control device 2100 displays local light fixtures, and provides an interface allowing the user to select a control program for a fixture, or otherwise control the relative intensities of the color lights to obtain a desired color corresponding to a desired streetscape goal.

FIGS. 22, 23, 24, and 25 illustrate an LED light module 2200 having a cylindrical body portion 2210 with a compressible washer 2215 that may be formed of rubber or other compressible material. Part of the washer 2215 may be formed with an opening to increase the amount of compression provided when the module 2200 is inserted into a fixture. Body portion 2210 may be formed of metal, such as aluminum or other heat conducting materials, and may have a heat sink portion 2220 formed on one end. The heat sink portion 2220 may be formed with fins 2222 or other structures to facilitate conduction of heat away from an LED supported by the module 2200 at the same end.

A second end of the body portion 2200 may include a foot 2225 spaced apart from the body portion and at least partially formed of an electrically insulating material. Foot 2225 is formed in an oval shape in one embodiment, with contacts 2230 positioned at both ends of the oval shape. The contacts extend to the side of the foot that is not shown, but is facing the compressible washer 2215. When the foot 2225 is inserted and into a bar of a matrix 2310 (in FIG. 23) and twisted into position, it compresses the washer 2215 against a portion of the bar, bringing the contacts into good electrical connection with power contacts 2310 in the bar to supply power to the module 2200. Conductors 2235 may be coupled to the contacts and fed through an opening in the foot back through the body portion to supply power to the LED. A further sealing washer 2240 may be provided on the body portion between the washer 2215 and the foot 2225 to form a weather tight seal against a socket in the matrix 2310 in further embodiments.

The module is inserted in the socket on the bar of the matrix, then turned into position as to align the contact points to a given circuit. The pressure on the contact points is developed from the compression of the weather sealing washer of the module, pulling in an outward manner, pulling out on the backside surface of the bar, sandwiching the bar between the foot of the module, and the inside of the matrix plate bar assembly creating extensive pressure on the contact points, resulting in reliable electrical contact through much expansion and contraction of the fixture in time.

Figure 24:
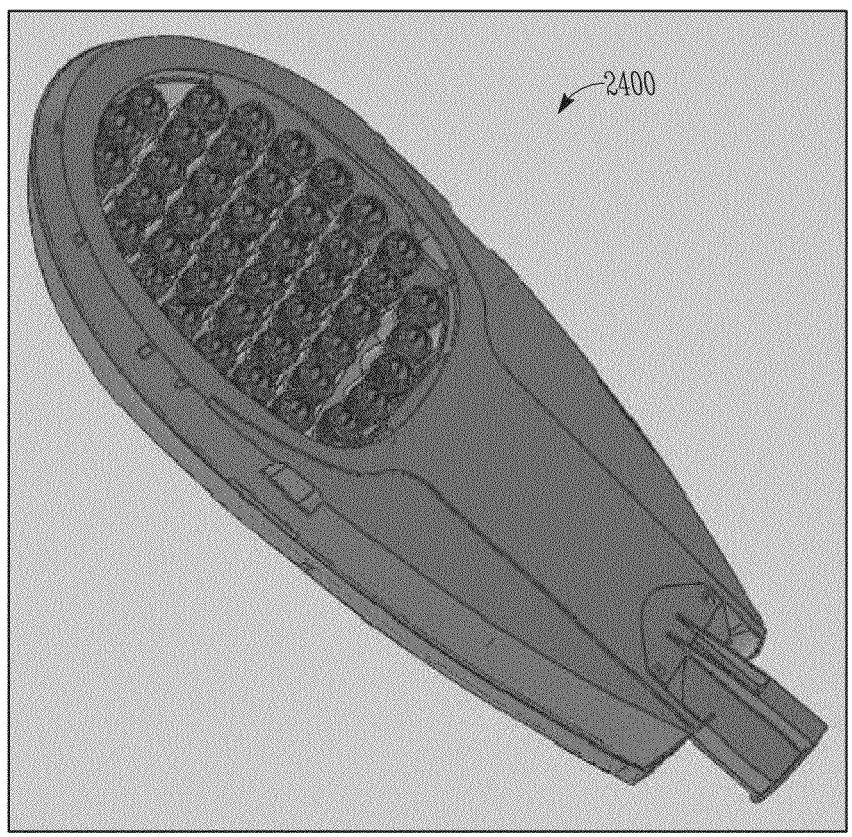
Figure 25:
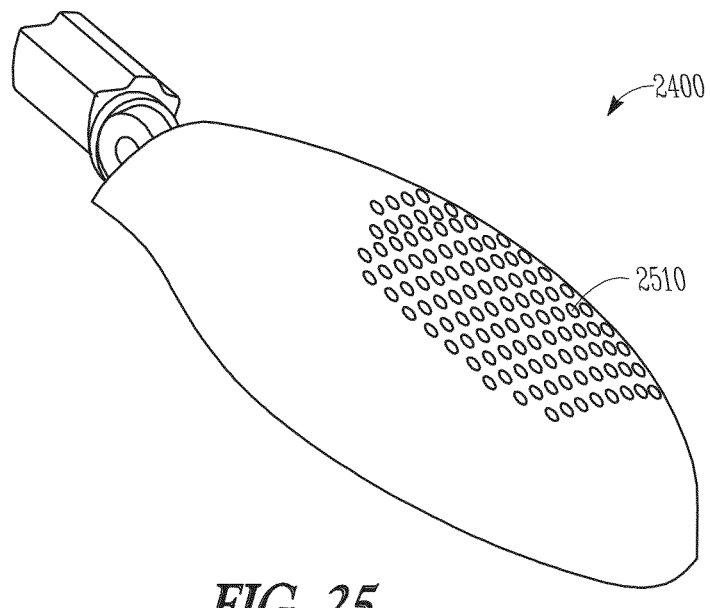

FIG. 24 illustrates a lighting fixture 2400 showing several light modules installed on multiple bars of a matrix. FIG. 25 is a top perspective view of light fixture 2400. Light figure 2400 in one embodiment is designed as an outdoor light fixture for outdoor lighting of large surface areas, and may be used as a street light or parking area light, as well as in many other outdoor applications. Holes 2510 may be provided to facilitate air circulation to convectively cool the modules in one embodiment. The modules are easily replaceable and have no moving parts in one embodiment.

Adendum including various statements related different inventions described in this application. While referred to as claims, they are not meant to be examined at this time, but to provide support for claims in further application.

Outdoor Statements:

1. A light fixture comprising:
   a matrix;
   a circuit board supported by the matrix;
   a plurality of electrical sockets fixedly coupled to the matrix and forming a matrix of electrical sockets, wherein the circuit board has conductors between the sockets to provide one or more sets of series connections of the sockets;
   a detection circuit associated with each socket to detect inoperative light emitting diode modules; and
   a transmitter coupled to the detection circuits for transmitting information identifying an array as having at least one inoperative light emitting diode plugged into a socket.

2. The light fixture of claim 1 wherein the light emitting diodes comprise modules for removable connection to the sockets 3. The light fixture of claim 1 wherein the transmitter includes a receiver to receive communications from other light fixture transmitters and forward such communications.

4. The light fixture of claim 1 wherein the transmitter includes a light fixture ID in transmitted information.

5. The light fixture of claim 1 wherein the sockets are electrically coupled via the circuit board in a desired pattern.

6. A method of maintaining light fixtures, the method comprising:
   identifying a high intensity light emitting diode that needs replacing in a light fixture having a high volume light emitting diode lighting array having a plurality of electrical sockets supported by a matrix and forming a matrix of electrical sockets;
   obtaining an ID of the light fixture; and
   transmitting the ID and an indication that a light emitting diode needs replacing, wherein the ID uniquely identifies the light fixture and has an associated location of the light fixture.

7. The method of claim 6 wherein transmitting further comprises transmitting the location of the light emitting diode in the light fixture that needs replacing.

8. The method of claim 6 and further comprising providing power to sockets following a socket that has a light emitting diode that needs replacing.

9. A method of maintaining light fixtures having arrays of light emitting diodes, the method comprising:
   receiving communications from multiple light fixtures identifying the light fixtures;
   correlating the light fixtures to physical locations of the light fixtures; and
   providing a list of physical locations needing light emitting diodes replaced.

10. The method of claim 9 wherein the communications identify a location within the a light fixture of the light emitting diode that needs replacing.

11. The method of claim 10 wherein the list provides an identification of the location within a light fixture of the light emitting diode that needs replacing.

12. The method of claim 11 wherein the list provides an indication of the type of light emitting diode to be replaced at each light fixture.

Module Statements:

1. A high intensity light emitting diode module for a high intensity light array, the module comprising:
   a high intensity light emitting diode;
   a heat sink thermally coupled to the high intensity light emitting diode;
   a pair of contacts coupled to the light emitting diode, each contact for matting with corresponding contacts on an electrical connection board having an array of contacts forming a high intensity light array to produce a large volume of light;
   a socket thermally coupled to the heat sink; and
   a sealing element adapted to be compressed against a portion of the socket to provide a sealed electrical contact with the electrical connection board when the pair of contacts are mated with the corresponding contacts on the electrical connection board.

2. The high intensity light emitting diode module of claim 1 wherein the pair of contacts coupled to the light emitting diode contact the corresponding contacts by twisting the module into the socket.

3. The high intensity light emitting diode module of claim 1 and further comprising a guide coupled to the high intensity light emitting diode adapted to fit with a mating guide coupled to the electrical connection board to align the contacts of the light emitting diode with the contacts on the electrical connection board.

4. The high intensity light emitting diode module of claim 1 wherein the sealing element comprises a compressible ring that provides a water tight seal with the socket when the module contacts are mated with the electrical connection board. sealing the electrical connection from outside elements.

5. The high intensity light emitting diode module of claim 4 wherein the compressible ring comprises an O-ring or a flat washer.

6. An array of high intensity light emitting diode modules, the array comprising:
   a matrix;
   a circuit board supported by the matrix;
   a plurality of electrical sockets fixedly coupled to the matrix and forming a matrix of electrical sockets, wherein the circuit board has conductors between the sockets to provide one or more sets of series connections of the sockets such that light emitting diode modules removably connected to all the sockets in a set cause a desired voltage drop, and wherein the sockets provide a pair of contacts for each module to sealingly retain each module in a water tight electrical connection with the socket.

7. The array of claim 6 wherein the sockets are electrically coupled via the circuit board in a desired pattern.

8. The array of claim 6 wherein the sets of series connected sockets have 10 or more sockets in each set.

9. The array of claim 6 wherein the sets of series connected sockets have a number of sockets in them equal to a supply voltage divided by a voltage drop per module.

10. An array of high intensity light emitting diode modules for high volume light applications, the array comprising:
  a matrix;
  a circuit board supported by the matrix;
  a plurality of electrical sockets fixedly coupled to the matrix and forming a matrix of electrical sockets, wherein the circuit board has conductors between the sockets to provide one or more sets of series connections of the sockets such that light emitting diode modules removably connected to all the sockets in a set cause a desired voltage drop, and wherein the circuit board provides a pair of contacts for each module and sealingly retain each module in a water tight electrical connection with the socket, and wherein each module comprises:
    a high intensity light emitting diode;
    a heat sink thermally coupled to the high intensity light emitting diode;
    a pair of contacts coupled to the light emitting diode, each contact having a portion shaped to electrically couple with corresponding contacts on an electrical connection board; and
    a sealing element adapted to be compressed against a socket to provide a sealed electrical contact with the electrical connection board when the pair of contacts are electrically coupled to the corresponding contacts on the electrical connection board, such that each module in the array of modules is replaceable.

11. The array of claim 10 wherein the array comprises a sufficient number of diode modules for large area outdoor lighting.

12. The array of claim 10 wherein the larger area outdoor lighting comprises parking lots, parking ramps, highways, streets, stores, warehouses, gas station canopies.

13. A high intensity light emitting diode module for a high intensity light array, the module comprising:
  a high intensity light emitting diode;
  a heat sink thermally coupled to the high intensity light emitting diode;
  a socket thermally coupled to the heat sink;
  a pair of contacts coupled to the light emitting diode, each contact having a portion shaped to electrically couple with corresponding contacts on an electrical connection board having an array of contacts forming a high intensity light array to produce a large volume of light;
  a sealing element adapted to be compressed against a portion of the socket to provide a sealed electrical contact with the electrical connection board when the pair of contacts are electrically coupled with the corresponding contacts on the electrical connection board.

The Abstract is provided to comply with 37 C.F.R. §1.72(b) to allow the reader to quickly ascertain the nature and gist of the technical disclosure. The Abstract is submitted with the understanding that it will not be used to interpret or limit the scope or meaning of the claims.

What is claimed is:

1. A light fixture comprising:
  a matrix;
  a circuit board supported by the matrix;
  a plurality of electrical sockets fixedly coupled to the matrix and forming a matrix of electrical sockets, wherein the circuit board has conductors between the sockets to provide one or more sets of series connections of the sockets;
  a detection circuit associated with each socket to detect inoperative light emitting diode modules; and
  a transmitter coupled to the detection circuits for transmitting information identifying an array as having at least one inoperative light emitting diode plugged into a socket.

2. The light fixture of claim 1 wherein the light emitting diodes comprise modules for removable connection to the sockets.

3. The light fixture of claim 1 wherein the transmitter includes a receiver to receive communications from other light fixture transmitters and forward such communications.

4. The light fixture of claim 1 wherein the transmitter includes a light fixture ID in transmitted information.

5. The light fixture of claim 1 wherein the sockets are electrically coupled via the circuit board in a desired pattern.

6. A method of maintaining light fixtures, the method comprising:
  identifying a high intensity light emitting diode that needs replacing in a light fixture having a high volume light emitting diode lighting array having a plurality of electrical sockets supported by a matrix and forming a matrix of electrical sockets;
  obtaining an ID of the light fixture; and
  transmitting the ID and an indication that a light emitting diode needs replacing, wherein the ID uniquely identifies the light fixture and has an associated location of the light fixture.

7. The method of claim 6 wherein transmitting further comprises transmitting the location of the light emitting diode in the light fixture that needs replacing.

8. The method of claim 6 and further comprising providing power to sockets following a socket that has a light emitting diode that needs replacing.

9. A method of maintaining light fixtures having arrays of light emitting diodes, the method comprising:
  receiving communications from multiple light fixtures identifying the light fixtures;
  correlating the light fixtures to physical locations of the light fixtures; and
  providing a list of physical locations needing light emitting diodes replaced.

10. The method of claim 9 wherein the communications identify a location within a light fixture of the light emitting diodes that need replacing.

11. The method of claim 10 wherein the list provides an identification of the location within a light fixture of the light emitting diodes that need replacing.

12. The method of claim 11 wherein the list provides an indication of the type of light emitting diodes to be replaced at each light fixture.

* * * * *